(12) United States Patent
Meyer et al.

(10) Patent No.: US 6,967,149 B2
(45) Date of Patent: Nov. 22, 2005

(54) STORAGE STRUCTURE WITH CLEAVED LAYER

(75) Inventors: Neal W. Meyer, Corvallis, OR (US); Andrew L. Van Brocklin, Corvallis, OR (US); Peter Fricke, Corvallis, OR (US); Warren Jackson, San Francisco, CA (US); Kenneth James Eldredge, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 3 days.

(21) Appl. No.: 10/718,137

(22) Filed: Nov. 20, 2003

(65) Prior Publication Data

US 2005/0112846 A1 May 26, 2005

(51) Int. Cl.⁷ .............................................. H01L 21/30
(52) U.S. Cl. ...................... 438/455; 438/458; 438/459; 438/588
(58) Field of Search ............................... 438/455, 458, 438/459, 588

(56) References Cited

U.S. PATENT DOCUMENTS

| | | | |
|---|---|---|---|
| 5,636,441 A | 6/1997 | Meyer et al. | |
| 5,682,188 A | 10/1997 | Meyer et al. | |
| 5,721,169 A * | 2/1998 | Lee | 438/278 |
| 5,851,902 A | 12/1998 | Sakai | |
| 5,950,067 A * | 9/1999 | Maegawa et al. | 438/22 |
| 5,994,207 A * | 11/1999 | Henley et al. | 438/515 |
| 6,093,623 A * | 7/2000 | Forbes | 438/455 |
| 6,159,825 A * | 12/2000 | Henley et al. | 438/460 |
| 6,180,496 B1 * | 1/2001 | Farrens et al. | 438/455 |
| 6,214,701 B1 * | 4/2001 | Matsushita et al. | 438/458 |
| 6,248,649 B1 | 6/2001 | Henley et al. | |
| 6,315,393 B1 | 11/2001 | Van Nice et al. | |
| 6,352,909 B1 * | 3/2002 | Usenko | 438/458 |
| 6,372,608 B1 * | 4/2002 | Shimoda et al. | 438/455 |
| 6,426,264 B1 * | 7/2002 | Kawai | 438/311 |
| 6,563,133 B1 * | 5/2003 | Tong | 257/52 |
| 6,600,173 B2 * | 7/2003 | Tiwari | 257/74 |
| 6,627,518 B1 * | 9/2003 | Inoue et al. | 438/458 |
| 2002/0081823 A1 * | 6/2002 | Cheung et al. | 438/455 |
| 2002/0119640 A1 * | 8/2002 | Gonzalez | 438/455 |
| 2003/0013274 A1 * | 1/2003 | Noda | 438/455 |
| 2004/0029357 A1 * | 2/2004 | Vyvoda et al. | 438/455 |

OTHER PUBLICATIONS

Simonton, Robert, "SOI Wafer Technology for CMOS ICs", 2002, Simonton Associates, pp. 1-11.
"Soitec Buys Selected Assets of Picogiga", Apr. 1, 2003, www.compoundsemiconductor.net/articles/news/7/4/1/1, pp. 1-2.
SiGen Research and Development Programs, www.sigen.com/research.htm, pp. 1-3.

* cited by examiner

*Primary Examiner*—Mary Wilczewski
*Assistant Examiner*—Toniae M. Thomas

(57) ABSTRACT

Apparatus and method for making a multi-layered storage structure includes forming a device layer on a single-crystal wafer, cleaving the device layer from the wafer, repeating the forming and cleaving to provide a plurality of cleaved device layers, and bonding the cleaved device layers together to form the multi-layered storage structure.

10 Claims, 4 Drawing Sheets

STORAGE STRUCTURE WITH CLEAVED LAYER

BACKGROUND OF THE INVENTION

The demand for semiconductor devices has increased dramatically over the years. Many frequently used electronic devices are made possible because of developments in semiconductor devices. As such devices become smaller, more sophisticated, and less expensive, the marketplace demands increasingly higher circuit densities, increased performance, and lower cost.

Increasing the density of semiconductor devices has been accomplished by reducing associated component area. Photolithography is nearing X-ray energy levels, however, and is encountering limits in further size reductions. Three-dimensional semiconductor-based structures have provided additional opportunities to increase density, but error probabilities are multiplied as the number of stacked layers increases, and statistics of yield quickly become unsatisfactory.

Crystal-based semiconductor devices generally provide better results than other devices, because regular arrays of atoms provide better electron movement than disordered arrays. At the same time, oxides are needed to keep electrons out of certain areas. Crystals cannot easily be stacked on top of amorphous or non-crystalline oxides, because crystal growth on top of a disordered substrate impedes proper registration of new atoms across the surface and often results in polycrystalline material. Additionally, once a device and a layer have been created, it is generally deleterious to subject them to further thermal input, as is often needed when a next layer is being formed. These and other challenges increase the difficulties and costs associated with stacked devices.

SUMMARY OF THE INVENTION

Apparatus and method for making a multi-layered storage structure includes forming a device layer on a single-crystal wafer, cleaving the device layer from the wafer, repeating the forming and cleaving to provide a plurality of cleaved device layers, and bonding the cleaved device layers together to form the multi-layered storage structure.

DETAILED DESCRIPTION

Figure 1:
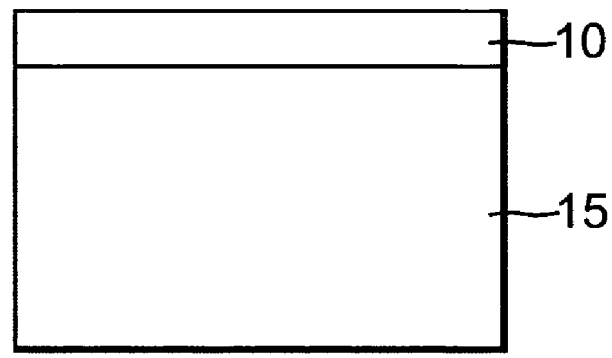
FIG. 1 is a cross-sectional view of a silicon wafer with implanted and deposited devices, according to an embodiment of the invention.

A method of making a multi-layered memory or other electronic storage structure according to an embodiment of the invention includes forming device layer 10 on single-crystal silicon wafer 15, as shown in FIG. 1. Device layer 10 includes devices such as diodes, transistors, antifuses, tunnel junctions, etc., which are implanted, deposited, or otherwise formed or provided in layer 10. Other examples of such devices include, but are not limited to, charge-coupled devices (CCDs), complementary metal oxide semiconductor (CMOS) imagers and other CMOS devices, tunnel diodes, charge pumps, and other devices.

Figure 2:
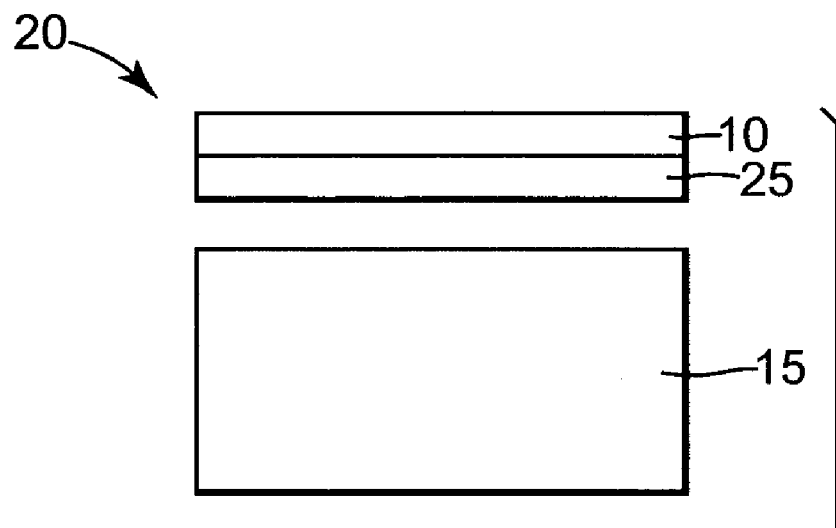
FIG. 2 is a cross-sectional view of the FIG. 1 wafer with a layer cleaved therefrom, according to an embodiment of the invention.

As shown in FIG. 2, the method further includes cleaving device layer 10 from wafer 15. Cleaved portion 20 includes device layer 10 and cleaved wafer section 25. Ion-implantation induced layer splitting of wafer 15, for example, using hydrogen or other light species, accomplishes the cleaving of portion 20 from wafer 15. The hydrogen or other ion penetrates to a desired depth and causes weakening at that depth upon heating. The weakening of the silicon layer causes cleaved wafer section 25 and device layer 10 to split or "peel" off wafer 15, allowing layer transfer to occur. According to another example, a layer of porous silicon is formed by anodic etching and annealing, to form the splitting layer. Other methods of cleaving portion 20 from wafer 15 also are contemplated.

Figure 3:
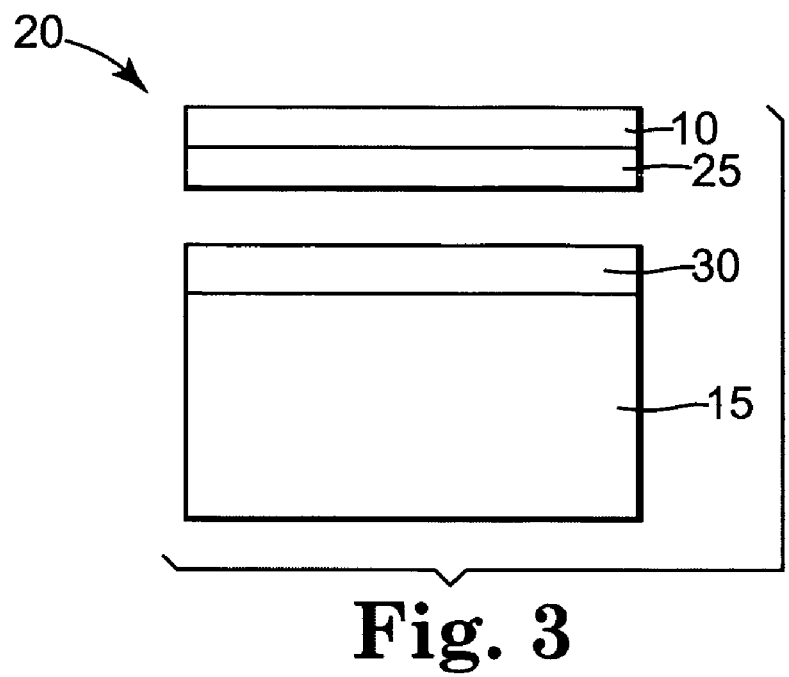
FIG. 3 is a cross-sectional view of the FIG. 2 wafer and layer, with additional devices implanted and deposited on the wafer, according to an embodiment of the invention.
Figure 4:
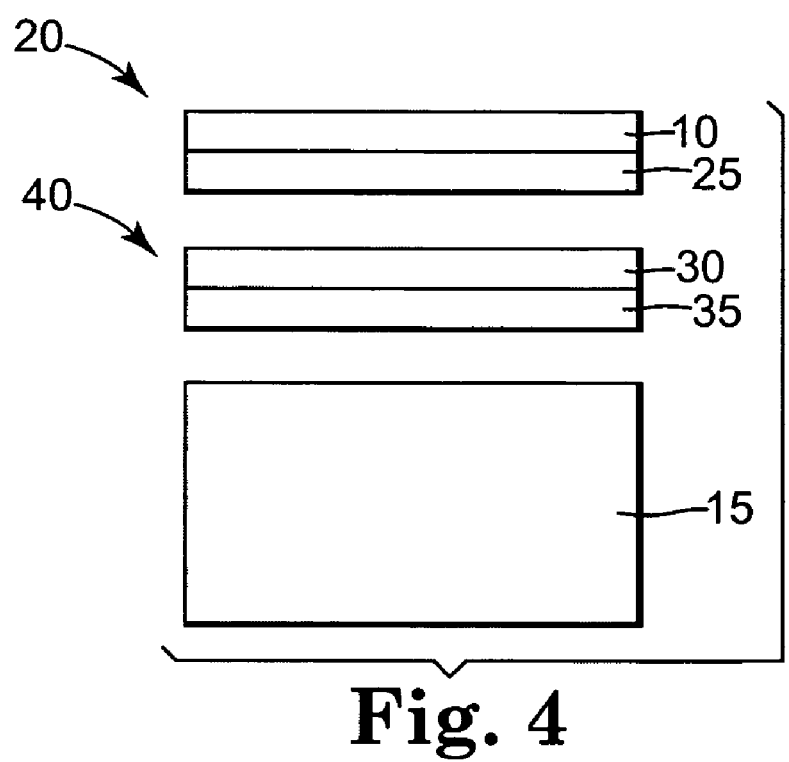
FIG. 4 is a cross-sectional view of the FIG. 1 wafer with a second layer cleaved therefrom, according to an embodiment of the invention.
Figure 5:
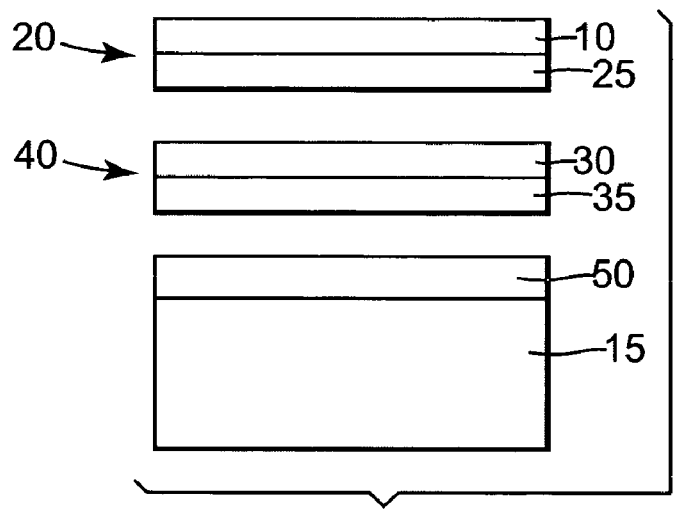
FIG. 5 is a cross-sectional view of the FIG. 4 wafer and layers, with additional devices implanted and deposited on the wafer, according to an embodiment of the invention.
Figure 6:
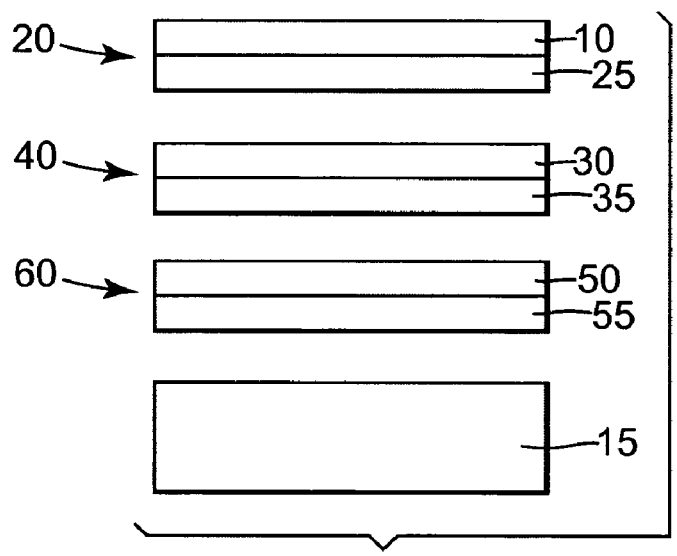
FIG. 6 is a cross-sectional view of the FIG. 1 wafer with a third layer cleaved therefrom, according to an embodiment of the invention.

As shown in FIG. 3, additional device layer 30 then is formed on wafer 15. As shown in FIG. 4, layer 30 and an associated cleaved wafer section 35 together form cleaved wafer portion 40, which is cleaved from wafer 15 in the same manner as cleaved wafer portion 20. The method thus includes repeating the forming and cleaving to provide a plurality of cleaved device layers originating from the same single-crystal silicon wafer 15. FIGS. 5–6 illustrate an additional repetition of the forming and cleaving, with additional device layer 50 and associated cleaved wafer section 55 forming another cleaved wafer portion 60.

Figure 7:
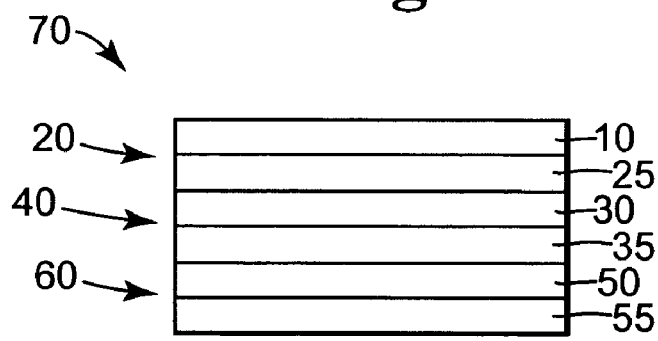
FIG. 7 is a cross-sectional view of three cleaved wafer layers bonded together, according to an embodiment of the invention.

The method also includes, as shown in FIG. 7, bonding the cleaved device layers 10, 30, 50 together, along with their associated cleaved wafer sections 25, 35, 55. Alternatively, parts or all of sections 25, 35, 55 optionally are removed or altered, for example by chemical mechanical polishing or planarization (CMP), to planarize the surface thereof and/or to define a metal interconnect pattern before bonding. The bonding optionally is accomplished using plasma-activated bonding, a similar silicon-on-insulator (SOI) process, or other standard bonding or laminating processes. Bonded wafer portions 20, 40, 60 together form multi-layered electronic storage structure 70, for example flash memory or other memory, a cross-point memory or other cross-point structure, one or more processors, etc. Structure 70 thus is a memory stack, for example, comprising a plurality of bonded memory layers 20, 40, 60 or 10, 30, 50, each memory layer being cleaved from single-crystal silicon wafer 15. Structure 70 optionally is used in forming a three-dimensional cross-point array memory structure.

Figure 8:
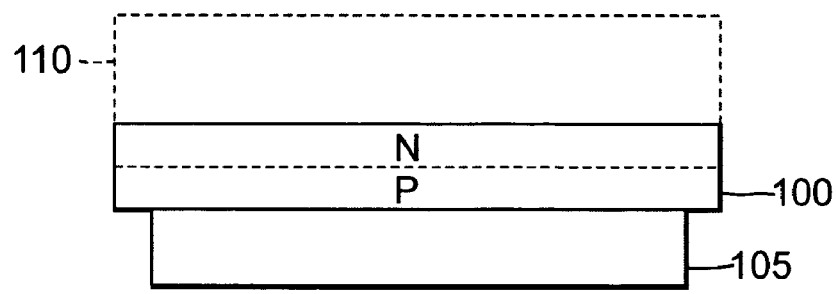
FIG. 8 is a cross-sectional view of a cleaved wafer applied to conductive traces, according to an embodiment of the invention.

FIGS. 8–11 illustrate a cross-point array structure having crystalline isolated diode pillars, using one or more cleaved wafers, and a method of making such a structure. Cleaved wafer portion 100 is provided from a wafer, such as wafer 15, in the manner described earlier. According to one example, wafer portion 100 is uniformly N-doped and/or forms N and P regions, as illustrated in FIG. 8. Conductive traces, such as row lines 105 formed of metal or silicide, for example, are provided on a base substrate or wafer (not shown). Cleaved portion 100 is placed over and bonded to row lines 105. Cleaved portion 100 includes sacrificial wafer portion 110, which is removed by CMP or other process after bonding.

Figure 9:
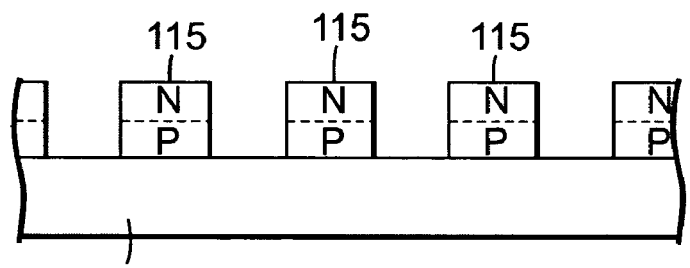
FIG. 9 is a cross-sectional view of diode pillars formed on conductive traces, according to an embodiment of the invention.
Figure 10:
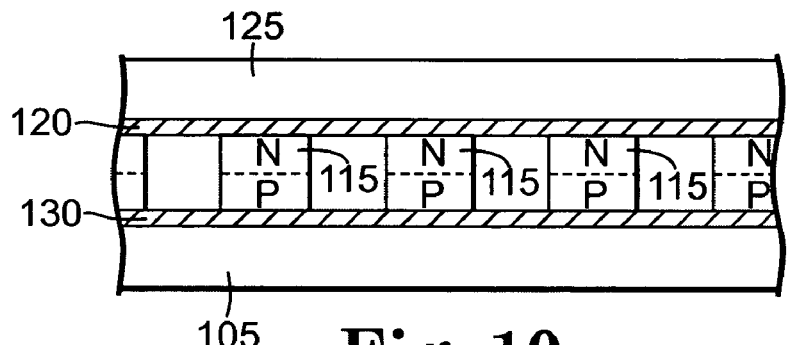
FIG. 10 is a cross-sectional view of a metal layer applied to the FIG. 9 structure, according to an embodiment of the invention.

With reference to FIG. 9, wafer portion 100 is lithographically etched to form vertical diodes 115. Viewed from the top, diodes 115 form a checkerboard pattern, according to one example. An interlayer dielectric (ILD) is applied, and a CMP process follows. Antiferromagnetic (AF) layer 120 then is applied, as shown in FIG. 10. AF layer 120 is a stress-relieve-oxide (SRO)—type AF layer, according to one example, to provide thicker oxide and better manufacturing tolerance. Metal layer 125 then is deposited. FIG. 10 also illustrates optional storage layer 130 applied between row lines 105 and diodes 115.

Figure 11:
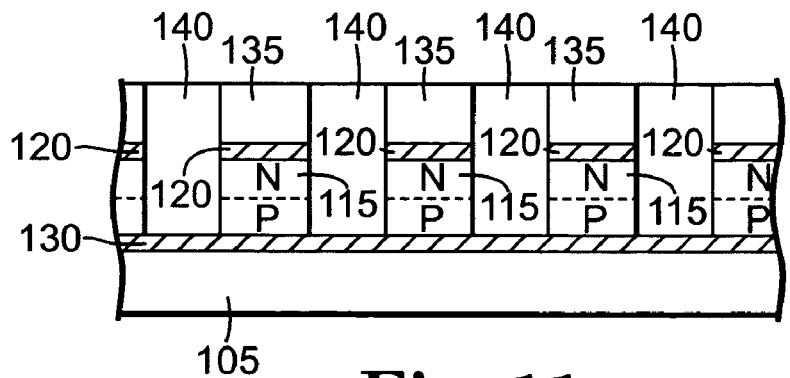
FIG. 11 is a cross-sectional view of a cross-point array formed from the FIG. 10 structure, according to an embodiment of the invention.

As shown in FIG. 11, metal layer 125 then is etched to form columns or column lines 135. ILD 140 then is deposited. CMP, application of additional layers, and/or other processing then occurs to form a complete cross-point structure. An insulating dielectric layer optionally is applied above column lines 135, for example, and then one or more additional complete sets of row lines 105, diodes 115, column lines 135 and/or other components added to form a stack of desired size, e.g. in the manner of layers or portions 20, 40, 60 of FIG. 7. It should be noted that separate etching of diodes 115 as represented in FIG. 9 can be eliminated, and column lines 135 instead used as a mask to create diodes 115 in FIG. 11. In either case, the resulting cross-point structure includes row lines 105, crystalline isolated diode pillars 115 crossing row lines 105, pillars 115 being formed from a cleaved wafer as described, and column lines 135 crossing pillars 115 and row lines 105. Diode pillars 115 are together cleaved from e.g. wafer 15 in a layer or portion 100, which is applied above row lines 105. Diodes 115 are P-N diodes, as illustrated, but also optionally comprise Schottky diodes or PIN diodes if desired. Antiferromagnetic layer 120 is applied between diode pillars 115 and column lines 135, and optional storage layer 130 is applied between row lines 105 and diode pillars 115. The cross-point structure optionally comprises memory, such as magnetic memory or other nonvolatile memory.

According to additional embodiments, a method of making a cross-point array structure includes patterning and/or implanting a single-crystal silicon wafer such as wafer 15, for example, with a pattern of squares generally in the manner of a checkerboard. A layer, such as layer 100, is cleaved from the patterned wafer, and the cleaved layer is applied over conductive traces such as row lines 105. The cleaved layer optionally is a P-N layer or other layer, as mentioned previously. Layer 100 is etched to create vertical diodes 115 in communication with conductive traces 105. A second conductive layer 125 is applied over layer 100, and conductive traces such as column lines 135 are patterned therefrom. Column lines 135 optionally are used in masking and patterning cleaved layer 100.

Embodiments of the invention provide performance advantages associated with single-crystal silicon, e.g. for devices in the upper levels of the cross-point or other array or structure. Embodiments of the invention are used to produce memory, such as flash memory or other nonvolatile memory with ability to block erasure of stored information. Such nonvolatile memory is competitive in speed with dynamic RAM, or at least roughly comparable, and provides virtually instant-on capabilities even after a power-off condition. Embodiments of the invention also provide high density, and high performance with dynamic switching. Other aspects of the invention will be apparent to those of ordinary skill.

What is claimed is:

1. A method of making a multi-layered storage structure, comprising:
   forming a device layer on a single-crystal wafer;
   cleaving the device layer from the wafer;
   repeating the forming and cleaving to provide a plurality of cleaved device layers;
   bonding the cleaved device layers together to form the multi-layered storage structure; and
   forming a three-dimensional cross-point array memory structure using the bonded device layers.

2. The method of claim 1, wherein the forming comprises implanting devices on the wafer.

3. The method of claim 1, wherein the forming comprises forming a device layer comprising devices selected from the group consisting of diodes, transistors, antifuses, and tunnel junctions.

4. A method of making a multi-layered storage structure, comprising:
   forming a device layer on a single-crystal wafer;
   cleaving the device layer from the wafer;
   repeating the forming and cleaving to provide a plurality of cleaved device layers; and
   bonding the cleaved device layers together to form the multi-layered storage structure, wherein the forming comprises forming a device layer comprising vertical diodes; further wherein the storage structure is a vertical memory structure.

5. The method of claim 1, wherein the repeating comprises forming the plurality of cleaved device layers from the same single-crystal wafer.

6. The method of claim 1, wherein the bonding comprises plasma-activated bonding.

7. The method of claim 1, wherein the cleaving comprises ion-implantation induced layer splitting of the wafer.

8. The method of claim 1, wherein the cleaving comprises anodic etching and annealing of the wafer.

9. The method of claim 1, wherein the storage structure comprises memory or a processor.

10. A method of making a multi-layered storage structure, comprising:
    forming a first device layer on a semiconductor substrate;
    cleaving, from the substrate, the first device layer and a first substrate section, the first substrate section being below the first device layer and including a first portion of the substrate;
    forming a second device layer on the substrate;
    cleaving, from the substrate, the second device layer and a second substrate section, the second substrate section being below the second device layer and including a second portion of the substrate; and
    bonding the first and second device layers to form the multi-layered storage structure.

* * * * *